(12) United States Patent
Wesström

(10) Patent No.: US 6,888,858 B2
(45) Date of Patent: May 3, 2005

(54) METHOD FOR FREQUENCY AND MODE STABILIZATION OF A TUNEABLE LASER

(75) Inventor: Jan-Olof Wesström, Stockholm (SE)

(73) Assignee: ADC Telecommunications, Inc., Eden Prairie, MN (US)

( * ) Notice: Subject to any disclaimer, the term of this patent is extended or adjusted under 35 U.S.C. 154(b) by 176 days.

(21) Appl. No.: 10/240,470

(22) PCT Filed: Mar. 7, 2001

(86) PCT No.: PCT/SE01/00478

§ 371 (c)(1),
(2), (4) Date: Feb. 11, 2003

(87) PCT Pub. No.: WO01/76028

PCT Pub. Date: Oct. 11, 2001

(65) Prior Publication Data

US 2003/0152117 A1 Aug. 14, 2003

(30) Foreign Application Priority Data

Apr. 5, 2000 (SE) .............................. 0001250

(51) Int. Cl.⁷ ............................. H01S 3/00; H01S 3/10; H01S 3/13
(52) U.S. Cl. .............................. 372/33; 372/20; 372/32
(58) Field of Search ............................. 372/20, 29, 33, 372/32

(56) References Cited

U.S. PATENT DOCUMENTS

| | | | | |
|---|---|---|---|---|
| 4,680,810 A | * | 7/1987 | Swartz ....................... | 398/197 |
| 5,359,613 A | * | 10/1994 | Mols et al. .................... | 372/20 |
| 6,064,681 A | * | 5/2000 | Ackerman .................... | 372/32 |
| 6,504,856 B1 | | 1/2003 | Broberg et al. ............... | 372/20 |
| 6,587,485 B1 | | 7/2003 | Renlund et al. ............. | 372/20 |
| 6,629,638 B1 | * | 10/2003 | Sanchez ..................... | 235/454 |
| 6,658,028 B1 | | 12/2003 | Andersson .................... | 372/18 |
| 6,658,033 B1 | | 12/2003 | Andersson .................... | 378/34 |

FOREIGN PATENT DOCUMENTS

| | | |
|---|---|---|
| EP | 0 529 732 A1 | 3/1993 |
| EP | 0 545 534 A1 | 6/1993 |
| EP | 0 615 321 A2 | 9/1994 |
| WO | WO 99/40654 | 8/1999 |
| WO | 00/54380 | 9/2000 |
| WO | WO 00/54380 | 9/2000 |
| WO | WO 01/76029 | 10/2001 |

OTHER PUBLICATIONS

Lavrova et al., "Accelerated Aging and Reliability Studies of Multisection Tunable GCSR Lasers for Dense WDM Applications," Optical Fiber Communication Conference, Mar. 7–10, 2000, vol. 1, ISBN: 1-55752-630-3.

* cited by examiner

Primary Examiner—Don Wong
Assistant Examiner—Hung Tran Vy
(74) Attorney, Agent, or Firm—Carlson, Caspers, Vandenburgh & Lindquist

(57) ABSTRACT

A method of frequency and mode stabilizing a tuneable laser, wherein one or more measurable magnitudes is/are measured, wherein the laser has been characterized with respect to a number of operation points, and wherein the values of the measurable magnitude or magnitudes are stored in a microprocessor or corresponding device. The invention is characterized by causing the values of one or more of the measurable magnitudes to be non-extreme values; storing the values of such non-extreme values as a quotient where the numerator is the derivative of a measurable magnitude $\delta Y$ with respect to a control current $\delta I$ to one laser section, and where the denominator is the derivative of another measurable magnitude $\delta Z$ with respect to said control current $\delta I$; and using the stored values to control the laser to a desired operation point.

12 Claims, 4 Drawing Sheets

METHOD FOR FREQUENCY AND MODE STABILIZATION OF A TUNEABLE LASER

The present invention relates to a method of stabilising frequency and mode of a tuneable laser.

Tuneable semiconductor lasers include several different sections through which current is injected, these sections typically being three or four in number. The wavelength, power and mode purity of the lasers can be controlled by adjusting the current in the different sections. Mode purity implies that the laser is at an operation point, i.e. in a combination of the three or four injected drive currents that is characterised by the laser being distanced from a combination of the drive currents with which mode jumps occur and where lasering is stable and sidemode suppression is high.

Special requirements are required for different applications with respect to controlling wavelength. In the case of telecommunications applications, it is necessary that the laser is able to retain its wavelength to a very high degree of accuracy and over a long period of time, after having set the drive currents and the temperature. A typical accuracy is 0.01 nanometer while a typical time period is 20 years.

In order to be able to control the laser, it is necessary to map the behaviour of the laser as a function of the different drive currents. This is necessary after manufacture but prior to using the laser.

It is also highly desirable to be able to lock the wavelength of a laser and have control over the mode in which the laser operates, so that said laser will operate as intended over a long period of time. By mode control is meant optimisation of the laser operation point in operation, either continuously or at regular intervals, so as to eliminate the risk of a mode jump to some other cavity mode. Furthermore, it would be very beneficial if lasers could be automatically compensated for degradation in operation.

Several methods of mobilising the frequency and mode of a tuneable laser are known to the art. Several of these methods involve adjusting a current through a laser section so that the laser will continue to lase at the right frequency, while adjusting the currents through other laser sections while seeking a maximum or minimum in some measurable function, such as the laser output power.

Swedish Patent Specification No. 9900537-3 describes a method of wavelength locking and mode monitoring a tuneable laser. In this method, as with other methods, the laser is controlled at an operation point which lies at an extreme point on the measurable functions.

Certain functions have no usable extreme point. For instance, the output power of a GCSR laser may have a sawtooth configuration. Consequently, no extreme value is reached before the laser jumps to the next mode.

It is often found that the best laser operation point does not lie on a usable extreme point of the measurable functions, since such points often mean that the laser operates close to a mode jump.

Consequently, it is beneficial to lock control of the laser at, for instance, a given gradient of a curve, such as the curve of the output power as a function of reflector current. However, this causes a problem when the laser degrades, since such curves become "stretched" as the laser ages, therewith changing the gradient of the curve.

The present invention solves the problem associated with the use of values that are not the extreme values of measurable magnitudes for controlling a laser that degrades.

Accordingly, the present invention relates to a method of stabilising the frequency and mode of a tuneable laser in which one or more measurable magnitudes are measured, said laser having been characterised with respect to a number of operation points, wherein the values of the measurable magnitude or magnitudes are stored in a microprocessor or corresponding device, and wherein the method is characterised in that the values of one or more of the measurable magnitudes are caused to be non-extreme values; in that the values of such non-extreme values are stored as a quotient where the numerator is the derivative of a measurable magnitude $\delta Y$ with respect to a control current $\delta I$ to one laser section, and where the denominator is the derivative of another measurable magnitude $\delta Z$ with respect to said control current $\delta I$; and in that the stored values are used to control the laser to a desired operation point.

The invention will now be described in more detail partly with reference to exemplifying embodiments thereof and partly with reference to the accompanying drawings, in which FIG. 1 is a schematic illustration of a laser;

Figure 1:
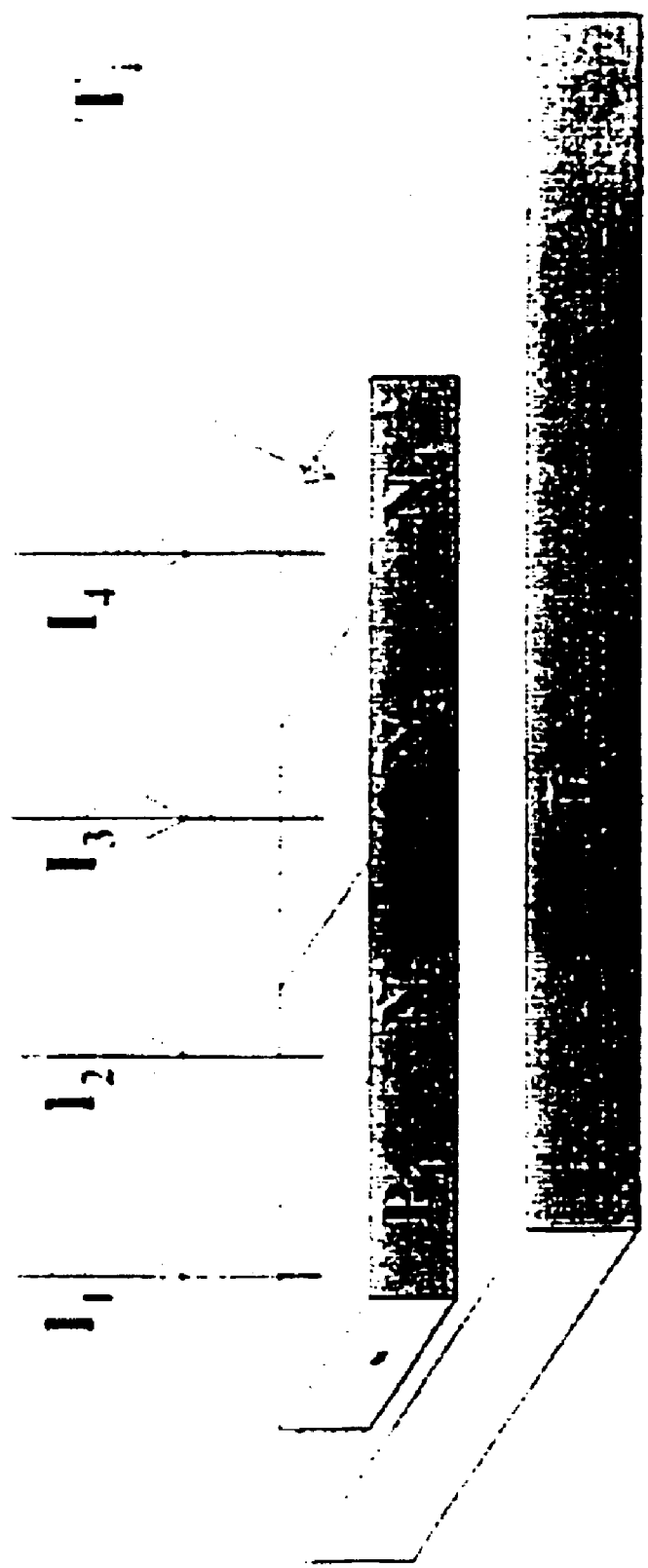
FIG. 1 illustrates a laser that has four sections P1, N2, N3 and N4 on a carrier TC, where currents I1, I2, I3 and I4 are injected into respective sections.

A laser is controlled by control variables in the form of currents that are injected into the different sections of the laser or in the form of the voltage applied across different sections, and also the carrier temperature T. These variables control a number of laser internal variables, of which the charge carrier density is the most essential. Temperature is ignored in the following, although it can be treated in the same way as the control currents I.

Directly measurable characteristics, such as the laser output power at the front mirror and back mirror respectively, the frequency of the laser, and sidemode suppression are all functions of said internal variables.

Only certain combinations of the internal variables result in desired laser properties, such as desired frequency, high sidemode suppression, desired output power, and sufficient distance to mode jumps.

When characterising the laser, good operation points are chosen at different frequencies and these frequencies stored in the form of different currents injected into the various laser sections.

The relationship between the internal variables and the control variables changes as the laser degrades.

However, it is not possible to measure the internal variables. Consequently, it is proposed in accordance with the invention that measurable variables are measured at the same time as secondary variables are formed so as to achieve correct laser control.

Secondary variables are created and used because after the laser has degraded the number of variables that can be measured directly is not sufficient to control the laser to operate in the same operation points as those established when characterising the laser.

Practically all measurable variables are functions of the internal variables, so that when the control currents are used to control the laser, by keeping said currents constant, the laser operation point will be displaced as a result of degradation of the laser.

Consequently, the secondary variables shall only be a function of the internal variables.

The present invention relates to a method of stabilising frequency and mode of a tuneable laser in which one or more measurable magnitudes is/are measured, said laser having been characterised with respect to a number of operation points and the values of the measurable magnitude or magnitudes having been stored in a microprocessor or corresponding device.

According to the invention, the values of one or more of the measurable magnitudes are caused to be non-extreme values and are stored as a quotient where the numerator is a derivative of a measurable magnitude with respect to a control current to a laser section and where the denominator is another measurable magnitude with respect to said control current.

Said secondary variable or variables is/are precisely such quotients of derivation, where such a quotient is not influenced by degradation of the laser and the secondary variable is a function of solely internal variables.

By using such secondary variables, it is possible to control the laser by measuring measurable variables, calculating the secondary variable or variables, and using a sufficient number of variables to control the laser to an operation point that coincides with an operation point that was selected when characterising the laser.

The use of said quotients of derivatives is based on the understanding that the quotient is constant despite the re-scaling of the ratio between charge carrier density and injected current that occurs as a laser degrades.

Figure 2:
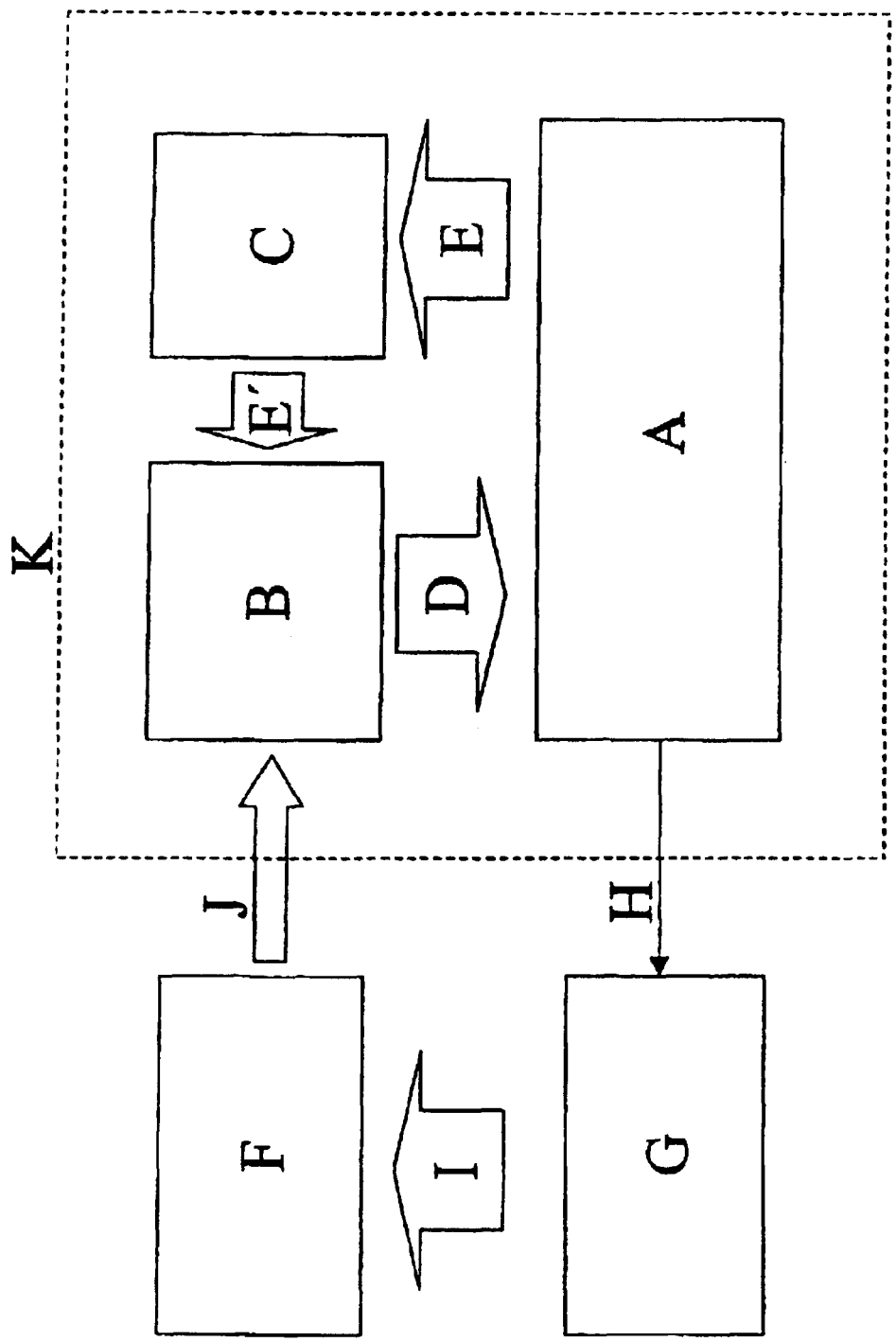
FIG. 2 is a block diagram.

FIG. 2 illustrates a control circuit and devices used in characterising a laser. In operation, the laser A is connected to a microprocessor B and to variable measuring units C. The laser A is controlled by the microprocessor B, which controls and adjusts the control currents D to the laser sections. These adjustments are based on measurements E from the measuring units C. The microprocessor B compares data E' received from the measuring units C with predetermined values obtained when characterising the laser, these values being stored in the microprocessor. The microprocessor also performs calculations of said derivatives. Upon completion of the comparison, the microprocessor makes any adjustments necessary to the control currents to the different laser sections.

In characterising the laser, the light H emitted is detected, for instance with respect to its power, sidemode suppression, frequency, etc., by analysing the light in a measuring instrument G that may include a spectrum analyser and a wavelength meter. The measured values I are sent to a computer F which is programmed to select optimal operation points, these operation points J then being transmitted to the microprocessor B. The microprocessor B performs calculations of desired derivative quotients and stores the same.

It is mentioned in the aforegoing that the quotient is such that the numerator is the derivative of a measurable magnitude with respect to a control current to a laser section, and that the denominator is the derivative of another measurable magnitude with respect to said control current.

According to a highly preferred embodiment of the invention, the second measurable magnitude is the frequency.

Figure 3:
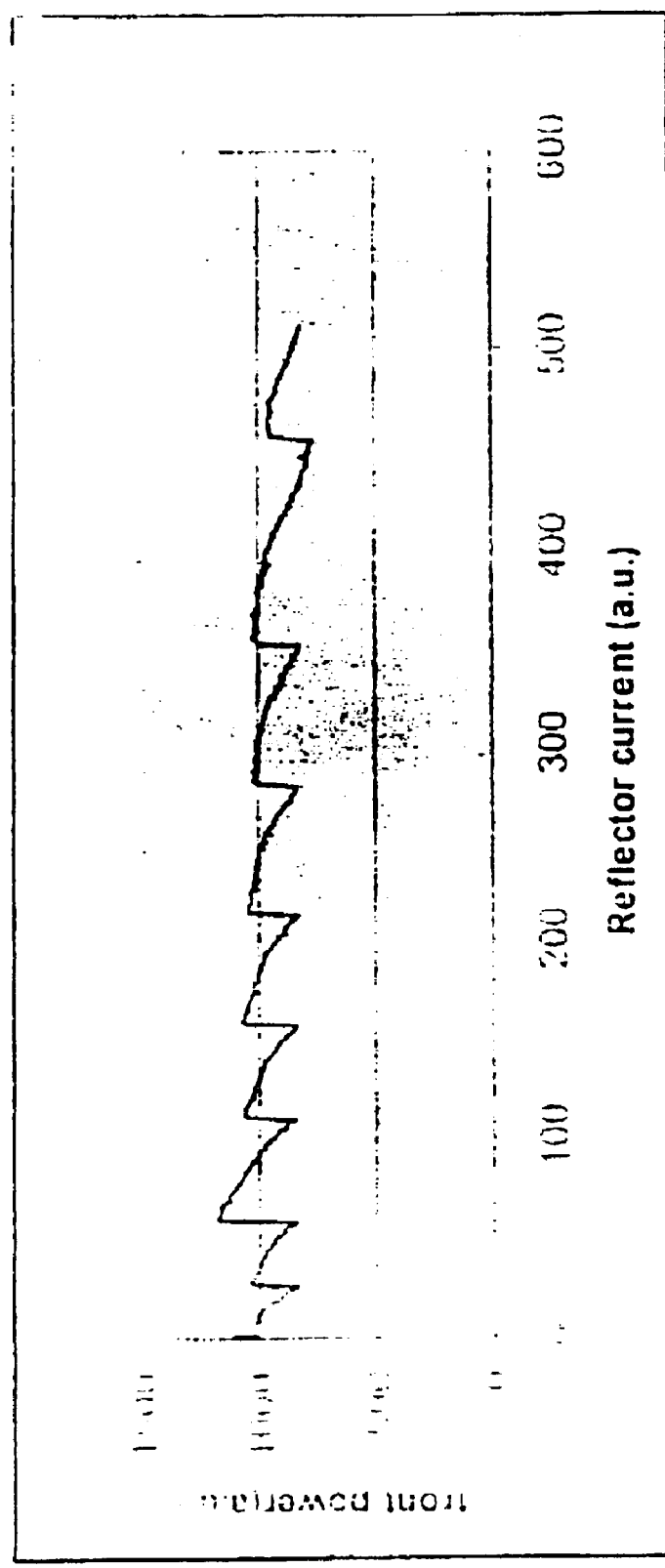
FIG. 3 is a diagram of front power as a function of reflector current in a GCSR laser.

FIG. 3 is a diagram showing the front power of a laser as a function of reflector current in a GCSR laser. An operation point is chosen between the extreme values in the curve.

In the illustrated case, the numerator of the derivative quotient is $\delta P/\delta I_R$ and the denominator is $\delta f/\delta I_R$, where P is power, f is frequency and $I_R$ is reflector current. This quotient is constant when the curve in FIG. 3 is stretched out in the X-direction as a result of degradation of the laser.

Naturally, corresponding derivative quotients can be formed with other measurable parameters so as to eliminate the influence resulting from a change in the relationships as a result of laser degradation in the same way.

According one preferred embodiment, the measurable magnitudes are one or more of the magnitudes laser front power, laser back power, and laser frequency.

It is highly preferred to cause said derivative quotients to be formed and used as control parameters in addition to using one or more control parameters that consist of measurable magnitudes.

A Bragg laser and a GCSR laser can be considered by way of example.

A Bragg laser has only three sections, these being a gain section, phase section and reflector section. It is easy to measure front power, back power and transmitted frequency.

When the front power is too low, it is reasonable to increase the current to the gain section. If the frequency becomes too low, it is reasonable to increase the current to both tuning sections.

Expressed simply, there are several operation points that give the same output power and the same frequency. Such an operation point may lie closer to a mode jump than another operation point. Consequently, it will not suffice to control the laser with the front power and the frequency and further relationships will be required to this end. One such further relationship that is independent of laser degradation is the aforesaid derivative quotient.

According to the present invention, when concerned with a laser that has three sections, such as a Bragg laser, the control currents to the gain section and the phase section of the laser are controlled on the basis of the values measured with respect to output power and wavelength, and the irritative current through the reflector section of the laser and its phase section are determined on the basis of the values of said quotients of said derivatives for the phase section or the reflector section.

With respect to a GCSR laser, which has four sections, it is suitable to control the gain section so as to obtain a desired output power and to control the phase section to obtain a desired frequency. However, there remain two other sections to be controlled.

As will be evident from FIG. 3, the derivative of the front power with respect to the reflector current varies significantly. It is therefore appropriate to lock this derivative at a given value and to appropriate this value as control data. However, the value changes with degradation of the laser. This re-scaling can be eliminated by dividing said derivative with another derivative, such as the derivative of the wavelength with regard to the same current. This can be effected for the coupler section. Four control parameters are obtained herewith, namely front power, frequency and two derivative quotients for the reflector current and the coupler current respectively. This gives four equations in an equation system that has four unknowns.

It is thus preferred in accordance with the invention to control a laser that has four sections, such as a GCSR laser, so that the control currents to the gain section of the laser and its phase section respectively are controlled on the basis of the values measured in respect of output power and wavelength, and so that the current through the coupler section and reflector of said laser will be determined on the basis of said quotients of respective derivatives.

It is thus apparent that the present invention not only eliminates stretching of relationships due to degradation but also provides a sufficient number of control variables to cause the laser to operate in the same operation point as that chosen when characterising the laser.

A particular problem occurs when a mode change shall take place from one operation point in one mode to another operation point in another mode in a degraded laser where various measurable magnitudes with respect to the control currents were established when characterising the function of the laser.

According to one preferred embodiment of the invention, this is carried out in the following manner.

There is calculated the change in current through one or more sections that has occurred as a result of degradation in order to retain a first operation point. The change in the derivative of a measurable magnitude, such as the frequency, with respect to the prevailing control current is also calculated. Changes in relevant functions are then evaluated, partly with the aid of the change in control current and partly with the aid of the associated change in relevant derivatives.

Figure 4:
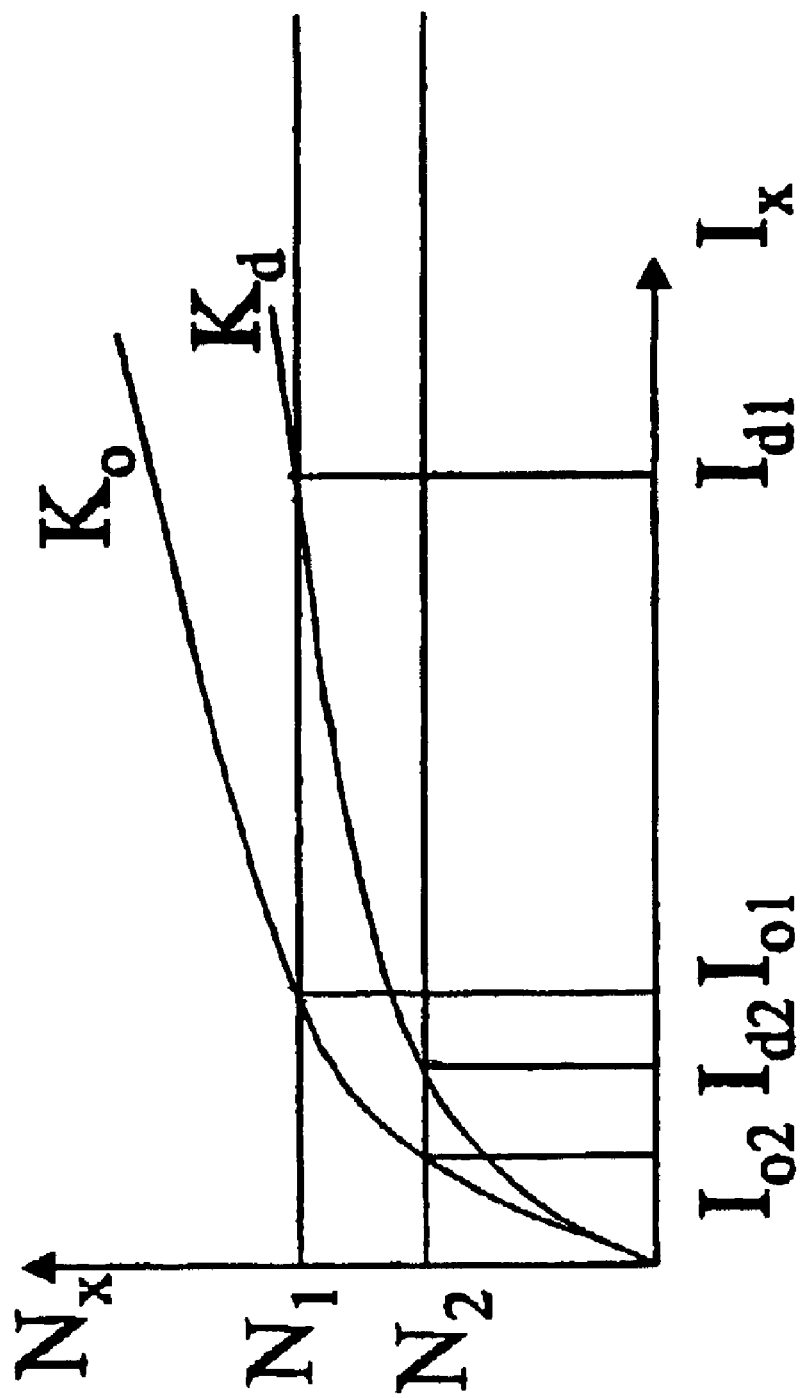
FIG. 4 is a diagram showing charge carrier density as a function of control current to a laser section.

This is illustrated in FIG. 4 with the aid of an example in which the ratio between the tuning current $I_x$ and the charge carrier density $N_x$ has changed as a result of degradation. $K_0$ is the original tuning curve. The curve has degraded to $K_d$ in time.

The laser first uses a charge carrier density $N_1$ that corresponds to the current $I_{01}$ through the laser section concerned. As a result of degradation, the control circuit changes the current to $I_{d1}$, therewith retaining the charge carrier density. A mode change is now desired to operation point 2 with charge carrier density $N_2$. When characterising the laser, the current $I_{02}$ was required to obtain this charge carrier density. The current $I_{d2}$ can now be approximated by virtue of knowing the difference between $I_{d1}$ and $I_{01}$ and the change in the derivative $\delta N/\delta I$ over time. This derivative, i.e. the charge carrier density with respect to current, cannot be measured but can be estimated owing to the fact that the change in the derivative is re-scaled upon degradation of the laser with the same factor as other derivatives with respect to the same current, for instance $\delta f/\delta I$.

The curve $K_d$ can be approximated on the basis of this difference and change. Laser control is then adjusted to the estimated operation point, whereafter adjustment is effected in accordance with the above by means of front power, wavelength and quotients of one or more derivatives until the desired new operation point has been obtained.

It is evident that the present invention solves the problem mentioned in the introduction.

Although the invention has been described with reference to a number of exemplifying embodiments thereof, it will be understood that other derivatives and quotients of derivatives can be formed in a corresponding manner for controlling a degraded laser to operate in a desired operation point.

It will therefore be understood that the present invention is not restricted to the aforedescribed embodiments thereof and that variations can be made within the scope of the following Claims.

What is claimed is:

1. A method of frequency and mode stabilising a tuneable laser, the laser having been characterized with respect to a number of operation points, the method comprising
measuring a plurality of values of measurable characteristics of the laser;
storing the measured values of the measurable characteristics, the values of one or more of the measurable characteristics being non-extreme values;
determining a ratio of a derivative, $\delta Y/\delta I$, of a first measurable characteristic, Y, having a non-extreme value with respect to a control current, I, over a derivative, $\delta Z/\delta I$, of a second measurable characteristic, Z, with respect to the control current, I; and
using the determined ratio to stabilize the laser to a desired operation point.

2. A method according to claim 1, wherein the second measurable characteristic is frequency of light output from the laser.

3. A method according to claim 1, wherein the measurable characteristics include front power, back power and light output frequency.

4. A method according to claim 1, further comprising forming control parameters from the ratio and from values of the measurable characteristics.

5. A method according to claim 1, wherein the laser has at least a gain section, a phase section and a reflector section, and further comprising controlling currents for the gain and phase sections based on measured values for output power from the laser and output frequency and controlling currents in the phase and reflector sections based on the ratio of the derivatives.

6. A method according to claim 5, wherein the control current, I, is one of the currents for one of the phase section and the reflector section.

7. A method according to claim 1, wherein the laser has at least a gain section, a phase section, a coupler section and a reflector section, and further comprising controlling currents for the gain and phase sections based on measured values of laser output power and frequency respectively, and controlling currents through the coupler and reflector sections based on the ratio of the derivatives.

8. A method according to claim 7, wherein the control current, I, is one of the currents for one of the phase section, the reflector section and the coupler section.

9. A method according to claim 1, further comprising measuring a current change in one or more laser sections needed to retain a desired operating point compared to a characterization current needed to retain the desired operation point when the laser was originally characterized, and estimating a change in derivative of charge carrier density with respect to one of the control currents by calculating the derivative of a measurable characteristic with respect to the one of the control currents.

10. A method according to claim 9, wherein estimating the change in derivative of charge carrier density includes measuring a change in laser frequency with respect to the one of the control currents.

11. A method according to claim 9, further comprising estimating changes in functions of different measurable characteristics with respect to control currents using changes in the control currents and associated changes and the estimated change in derivative.

12. A method according to claim 11, further comprising forming new functions of the different measurable characteristics with respect to the control currents, based on the estimated change in derivative, and using the new functions to control operation of the laser.

* * * * *